United States Patent [19]

Soohoo

[11] Patent Number: 4,847,561
[45] Date of Patent: Jul. 11, 1989

[54] DOMAIN AND DOMAIN WALL TRANSITION SPECTROSCOPY

[76] Inventor: Ronald F. Soohoo, 568 Reed Dr., Davis, Calif. 95616

[21] Appl. No.: 186,491

[22] Filed: Apr. 26, 1988

[51] Int. Cl.$^4$ .................... G01V 3/00; G01R 33/00; G01R 27/04
[52] U.S. Cl. .................... 324/316; 324/586; 324/262
[58] Field of Search ............. 324/316, 317, 318, 319, 324/320, 321, 322, 58 C, 58.5 C, 262

[56] References Cited

U.S. PATENT DOCUMENTS 3,691,453  9/1972  Rupp, Jr. et al. ............. 324/316

Primary Examiner—Reinhard J. Eisenzopf
Assistant Examiner—Walter E. Snow
Attorney, Agent, or Firm—Townsend and Townsend

[57] ABSTRACT

This invention involves resonance enhancement of signals obtained from magnetic specimen undergoing changes in magnetic state. This is accomplished by placing the sample, magnetized by a quasi-static magnetic field, in a high frequency resonant cavity. By adjusting the resonance frequency of the sample-containing cavity so that it is resonant at a d.c. field corresponding to domain wall motion or domain rotation, clear signals can be obtained from the sample.

1 Claim, 2 Drawing Sheets

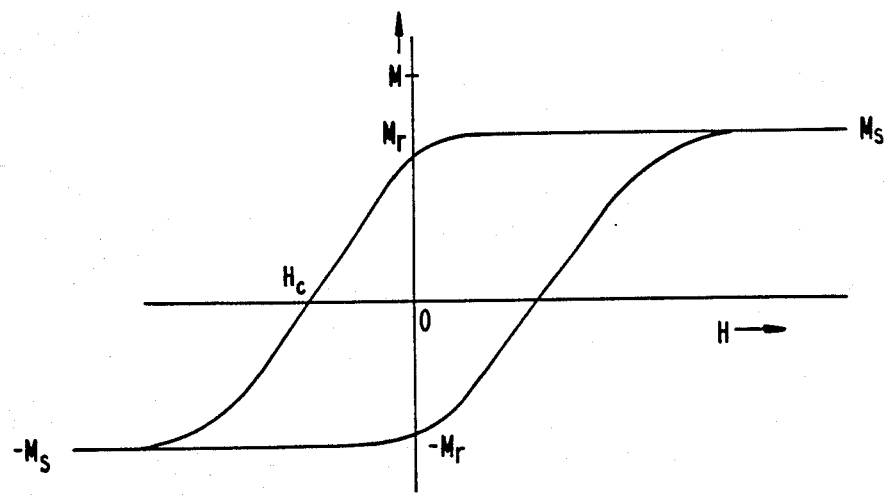
FIG._1.  PRIOR ART
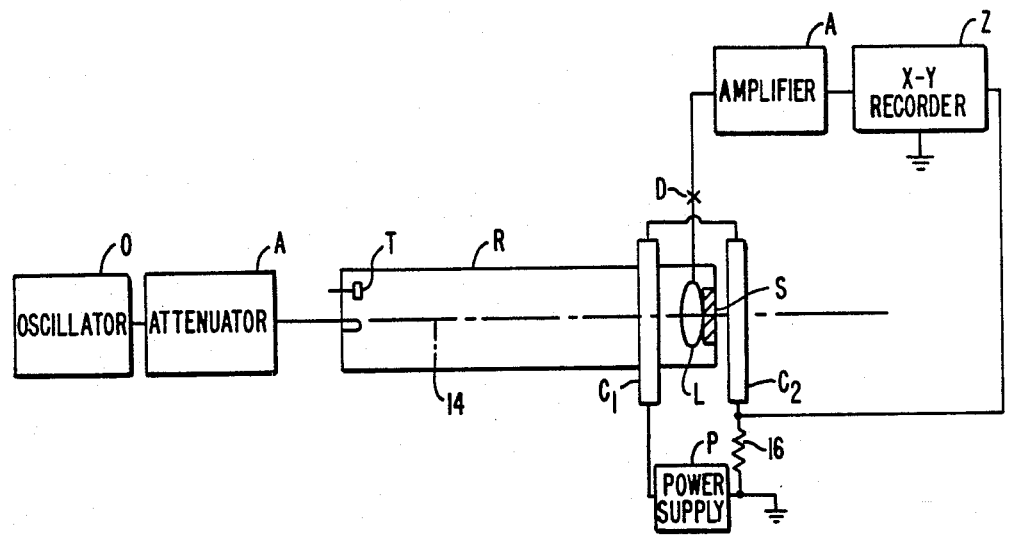
FIG._2.

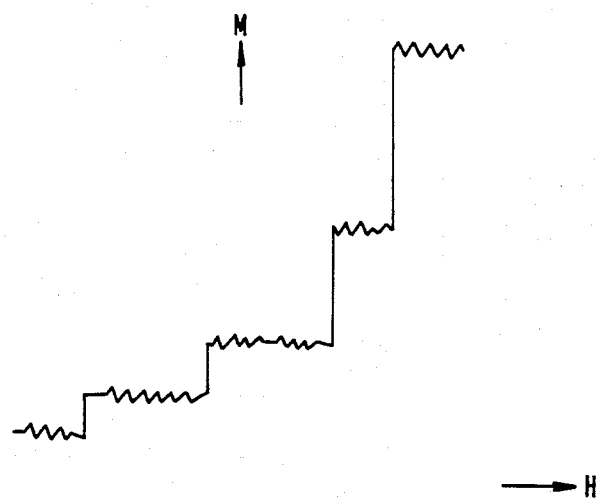
FIG._3.
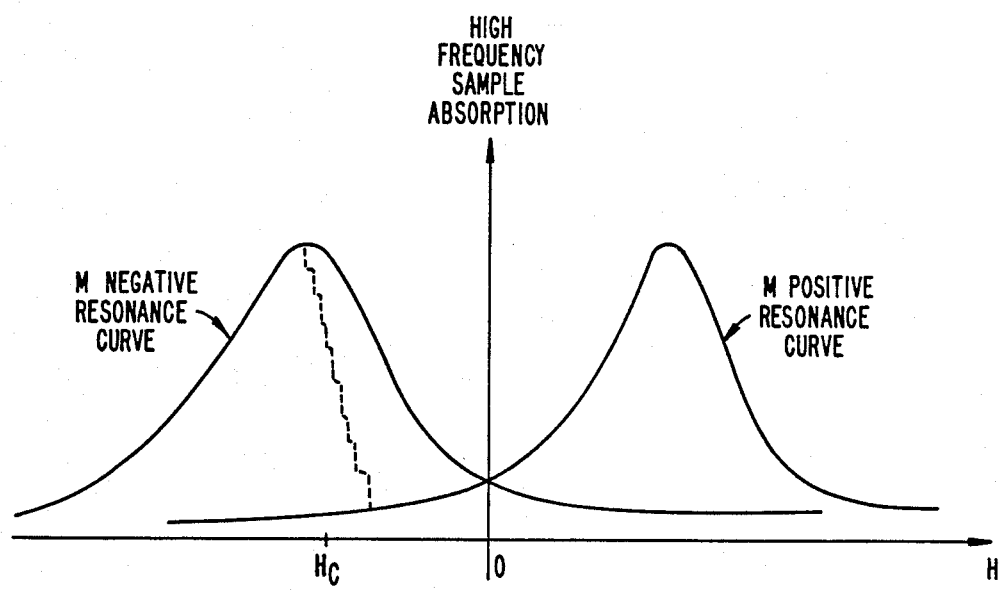
FIG._4.

DOMAIN AND DOMAIN WALL TRANSITION SPECTROSCOPY

BACKGROUND OF THE INVENTION

This invention relates to analysis of magnetic specimens undergoing changes in magnetic states. More particularly, a sample magnetized by a quasi-static magnetic field is resonated in a high frequency cavity of adjustable dimension so that clear magnetic signals of domain wall motion and domain rotation can be obtained. Utility includes use in in the design and composition of magnetic recording media.

SUMMARY OF THE PRIOR ART

Every ferromagnetic, anti-ferromagnetic, and ferrimagnetic material is characterized by a hysterisis loop such as the one shown in FIG. 1, in which the magnetization M of the material is plotted against the applied magnetic fields H. Different materials are distinguished by their values of saturation magnetization $M_s$, remanent magnetization $M_r$, and coercivity $H_c$. The hysterisis loop is usually displayed by a hysterisis looper screen and the different branches of the loop appear smooth and continuous as depicted in FIG. 1. In reality, the magnetization M may change in discontinuous steps as the applied magnetic field is changed; the location of these steps may change as H is cycled from positive to negative values.

In accordance with the prior art, to exhibit the individual discontinuities unambiguously, one would have to run the looper screen at extremely low frequencies. Unfortunately, at such low frequencies, luminescence of the looper screen is such that the discontinuities are basically invisible. Futhermore, according to Lenz's Law, the pickup voltage V from which M is derived is directly proportional to the rate of change of M with time t, i.e., $$V = -NA_d \frac{dM}{dt} \qquad (1)$$

where N is the number of turns in the pickup coil and A is its area. Thus, at extremely low looper screen frequencies, V is correspondingly reduced, to a point where electronic system noise may render the M vs H data of dubious value.

SUMMARY OF THE INVENTION

This invention involves resonance enhancement of signals obtained from magnetic specimen undergoing changes in magnetic state. This is accomplished by placing the sample, magnetized by a quasi-static magnetic field, in a high frequency resonant cavity. By adjusting the resonance frequency of the sample-containing cavity so that it is resonant at a d.c. field corresponding to magnetic domain wall motion or magnetic domain rotation, clear signals can be obtained from the sample.

In our method, the material is subjected to a superposition of quasi-static and high frequency magnetic fields. Since the detected signal is proportional to the rate of change of the high frequency field, the signal to noise ratio is greatly enhanced. Furthermore, by placing the sample in a tunable high frequency cavity, the signal is further increased by a factor of Q (quality factor of the cavity) which can range up the 10,000.

This method is novel in that it is the first time that the resonance effect is combined with domain switching to greatly enhance the signal from the sample, to a point where the thresholds and range of the switching fields can be easily measured. Such quantitative measurements were not possible up to now. This invention is useful for magnetic materials research toward the development of magnetic devices with desirable characteristics.

Other objects, features and advantages will become more apparent after referring to the following drawings in which:

FIG. 1 is a drawing of a prior art hysterisis loop illustrating the normal form;

FIG. 2 is a schematic of the apparatus of this invention illustrating both the apparatus and process for analysis of magnetic media subject to magnetic domain wall motion and magnetic domain rotation;

FIG. 3 is a graphic representation of the discrete steps of magnetization transitions rendered by the apparatus and process of this invention;

FIG. 4 is a plot of the positive-M and negative-M magnetic resonant curves illustrating on the negative side a transition between the low value of the positive resonance curve and the corresponding maximum valve of the negative resonance curve; this step-like curve is similar to the type of curve shown in FIG. 3.

Magnetization changes can occur either via domain wall motion or domain rotation. In domain wall motion, we can expect the magnetization changes to occur in discrete steps as domain walls are detached from imperfections in the material. In domain rotation, magnetization changes should proceed continuously with changing magnetic field. Theses two processes proceed at different speeds, different noise levels, and different degrees of reversibility; these factors in turn determine the operational characteristics of dynamic magnetic devices such as magnetic recording heads and disk used in digital computers. Thus, an unambiguous method of determining the magnetization reversal mechanism would be valuable to magnetic materials research toward the development of magnetic devices with desirable characteristics. In what follows, I shall describe in more detail a method involving resonance enhancement of high frequency signals obtained from magnetic specimen undergoing changes in magnetic state.

Referring to FIG. 2, the samples are magnetized by a quasi-static magnetic field. The quasi-static magnetic field is supplied by a pair of coils $C_1$ and $C_2$. Coils $C_1$ and $C_2$ impose a quasi-static magnetic field on a high frequency resonant cavity R by surrounding the high frequency resonant cavity R. It is the combination of the quasi-static magnetic field and the resonant magnetic field that produces the discrete magnetic outputs of this invention. The quasi-static magnetic field can be changed relatively slowly by changing the voltage of the power supply P.

The electromagnetic fields in the cavity to which the sample is also subjected can be supplied by a high frequency oscillator O (from very low frequencies up to the microwave band) via a signal level control and oscillator stabilization device such as an attenuator A. Preferably, the high frequency resonant cavity R is fabricated from nonmagnetic material and telescopes in length via plunger T so that the volume of the cavity can be adjusted for optimum measurement conditions. A coil having an axis normal to the axis 14 of the cavity can be used to couple the high frequency energy to the cavity.

The signal from the sample is detected at a coil loop L the axis of which is normal to the axis 14 of cavity R. This signal then passes to a crystal detector D and is amplified at amplifier A before being applied to the vertical axis of an X-Y recorder Z.

By also applying the voltage across a resistor 16 in series with the coils $C_1$ and $C_2$ and power supply P to the x-axis of the x-y recorder, the resonance curve (absorption of the high frequency energy of the sample vs. quasi-static applied magnetic field) can be displayed. Such a resonance curve is shown in FIG. 4.

Some general comments can be made about the relative orientations of the respective magnetic field required for this test apparatus and procedure. First, the resonating magnetic field within the cavity R is chosen to be along one axis—here the normal to longitudinal length of the chamber. Second, the quasi-static magnetic field is chosen to be normal to the resonating magnetic field—here parallel to the longitudinal length of the chamber.

These two alignments are preferred to measure the desire magnetic domain wall motion and magnetic domain rotation. However, the reader will understand that precisely normal alignment is not required. It is only required that there be intersection between the fields.

The measuring loop only need be proximate to the sample to measure the change of the magnetization of the sample.

It will be understood that I show a telescoping resonating cavity. Other expedients to change the resonance of the cavity could be used as well. For example, substitution of cavities having different dimensions could as well occur.

Referring again to FIG. 4, by adjusting the resonance frequency of the cavity so that it is resonant at a quasi-static magnetic field corresponding to approximately $H_c$ of FIG. 1, clear signals (enhanced by the use of high frequency from the oscillator, by magnetic resonance, and by cavity R) can be obtained from the sample by monitoring the cavity output. Depending on whether the M changes via domain wall motion or domain rotation, the M-H curve can be either smooth or contain discrete jumps. An example has been given in FIG. 3 for the region residing between $M_r$ and $-M_s$ of the hysterisis loop of FIG. 1. This curve displays discrete jumps and oscillatory behavior between these jumps.

To observe domain rotation and/or domain-wall motion, the following procedure should be followed:

(1) Estimate or obtain from another experiment using, e.g., the hysterisis looper screen, the value of the coercivity $H_c$ of the sample.

(2) Compute the resonance frequency $\omega_r$ of the sample biased by quasi-static applied field H equal to $H_c$. This value of $\omega_r$ will depend on the magnetization M, anisotropy field $H_k$, and the geometry of the sample.

(3) Set the oscillator frequency $\omega$ to $\omega_r$.

(4) Tune the cavity so that its resonance frequency $\omega_o$ is equal to $\omega$. At this point, the combination of steps (2), (3) and (4) yields the equality of three frequencies, i.e., $\omega_r = \omega = \omega_o$.

(5) Plot the power output from the cavity as a function of the quasi-static applied field H. Except for a constant, and sign, this output power is proportional to the high frequency resonance power absorption by the sample. The power absorption is plotted as a function of H in FIG. 4. Note the transition from low to high resonance absorption occurs when H is about equal to $H_c$: this type of transition was also depicted in FIG. 3.

What is claimed is:

1. A process for testing of a sample of magnetic material to determine the magnetic domain and domain wall spectra of said sample comprising the steps of:

providing a magnetic sample having a certain magnetization, anisotropy, coercivity, and geometry;

providing an adjustable resonant cavity into which high frequency radiation with a magnetic field along a first axis of said cavity is introduced;

providing an adjustable high frequency source communicated to said adjustable resonant cavity;

providing an adjustable quasi-static magnetic field communicated across said cavity, said adjustable quasi-static field being disposed at an angle to the magnetic field induced by said high frequency radiation in said adjustable cavity;

computing the resonant frequency of said sample at a magnetic field H equal to the coercive force $H_c$ in said cavity as function of the magnetization of said sample, the anisotropy of said sample, the geometry of said sample;

adjusting said adjustable resonant cavity to resonate at said computed resonant frequency of said sample;

adjusting said adjustable high frequency source to said adjustable cavity resonance frequency, as well as to said resonance frequency of said sample in said cavity;

plotting the power output from the cavity as a function of the quasi-static magnetic field H applied to the sample in the cavity to determine the magnetic transitions of the sample at a quasi-static magnetic field H nearly equal to the coercivity of the sample.

* * * * *